(12) United States Patent
Asam et al.

(10) Patent No.: US 10,917,073 B2
(45) Date of Patent: Feb. 9, 2021

(54) OUTPUT FILTER FOR AN ELECTRONIC CIRCUIT

(71) Applicant: NEXPERIA B.V., Nijmegen (NL)

(72) Inventors: Geethanadh Asam, Nijmegen (NL); Harrie Horstink, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 16/664,454

(22) Filed: Oct. 25, 2019

(65) Prior Publication Data

US 2020/0136591 A1 Apr. 30, 2020

(30) Foreign Application Priority Data

Oct. 26, 2018 (EP) .................................. 8202939

(51) Int. Cl.
*H03K 5/00* (2006.01)
*H03H 11/04* (2006.01)

(52) U.S. Cl.
CPC .................................. *H03H 11/04* (2013.01)

(58) Field of Classification Search
CPC . H03H 11/04; H01L 27/0288; H01L 27/0266; H02H 9/046
USPC ........................................................ 327/559
See application file for complete search history.

(56) References Cited

U.S. PATENT DOCUMENTS

| 7,142,400 | B1 * | 11/2006 | Williams | G06F 1/305 |
| | | | | 361/18 |
| 2013/0057992 | A1 * | 3/2013 | Altolaguirre | H02H 9/046 |
| | | | | 361/56 |
| 2013/0155566 | A1 | 6/2013 | Ker et al. | |
| 2016/0211751 | A1 * | 7/2016 | Kurozo | G05F 1/569 |
| 2016/0285257 | A1 * | 9/2016 | Tsaur | H02H 9/046 |
| 2017/0250043 | A1 * | 8/2017 | Hurwitz | H03H 21/0012 |

OTHER PUBLICATIONS

Extended European Search Report for priority European application No. 18202939.7, 7 pages, dated Apr. 16, 2019.

* cited by examiner

*Primary Examiner* — Ryan Jager
(74) *Attorney, Agent, or Firm* — Ohlandt, Greeley, Ruggiero & Perle, LLP

(57) ABSTRACT

This disclosure relates to a filter circuit for an output stage of an electronic circuit. The filter circuit includes a capacitor connected between a supply voltage and a first transistor. The first transistor is arranged as a diode connected transistor; a second transistor is connected to the first transistor so that the first and second transistors are arranged as a current mirror. The capacitor is connected to the first and second transistors and configured and arranged so that during operation the first transistor, the second transistor and the capacitor operate as a high pass filter.

18 Claims, 7 Drawing Sheets

OUTPUT FILTER FOR AN ELECTRONIC CIRCUIT

CROSS REFERENCE TO RELATED APPLICATIONS

This application claims the benefit under 35 U.S.C. § 119(a) of European Application No. 18202939.7 filed Oct. 26, 2018 the contents of which are incorporated by reference herein in their entirety.

BACKGROUND OF THE DISCLOSURE

1. Field of the Disclosure

The present disclosure relates to a filter circuit for an output stage of electronic circuit. In particular, the present disclosure relates to a filter circuit for a CMOS driver output circuit. The present disclosure also relates to an output stage of an electronic circuit comprising the filter.

2. Description of the Related Art

Functional circuits such as logic gates and buffers typically use CMOS output driver circuits and dependent on the nature of the circuit connected to the output, the output drivers can drive variable capacitive loads. The output driver is designed to drive the external capacitance with specific rise/fall times, dependent on the application, of the external circuit. Unwanted voltage spike events can occur on the signal outputs of such electronic integrated circuits. These unwanted events, also known as bumps, can have a magnitude that is less than a supply voltage of the electronic integrated circuit. A bump may be defined as an unwanted voltage or signal on the output of an electronic circuit, such as a logic circuit.

If the external capacitance connected to the output of the electronic circuit is a certain value (farads) and a parasitic capacitance of the output driver circuit between supply and output capacitance is a fraction of the external capacitance then a certain fraction of the supply voltage may appear as a bump, on the output of the driver when supply ramps up.

As the rate of change of the electronic circuit supply voltage (typically designated as VCC) over time, known as the ramp rate, increases, high frequency coupling effects may arise leading to the unwanted bumps and disturb the signal integrity.

Looking at a generalised data transfer system as illustrated in FIG. 1, data is received at an input of a first circuit, System A. The output of the first circuit is connected to the input of a second circuit, System B, and the second circuit provides a data output for connection to further circuitry (not illustrated). During operation the second circuit may be powered up and ready to receive data from the first circuit, but the first circuit may not be ready to transfer data to the second circuit. In this situation, if there are any bumps, or unwanted voltages or signals generated by the output driver of the first circuit, they will be transferred to the second circuit. If the amplitude of the bump is greater than an input threshold voltage of the second circuit the bump will be processed by the second circuit which may lead to an erroneous and unwanted signal at the output of the second circuit.

Currently the effects of the bumps can be reduced by synchronising the turn on of the electronic circuit supply voltage with the turn on of the second circuit. However, synchronisation requires an additional timing signal between the two circuits which prevents switch on of the second circuit until the bump has passed.

SUMMARY

Various example embodiments are directed to issues such as those addressed above and/or others which may become apparent from the following disclosure concerning minimising high frequency supply coupling to the output load of electronic circuits and in particular, minimising the generation of undesired voltage spikes or bumps on the output of such electronic circuits.

In certain example embodiments, aspects of the present disclosure involve attenuation of undesired voltage spikes or bumps on output pad(s) or pin(s) of an electronic circuit.

According to an embodiment there is provided a filter circuit for an output stage of electronic circuit, the filter comprising: a capacitor connected between a supply voltage and a first transistor wherein the first transistor is arranged as a diode connected transistor; a second transistor connected to the first transistor such that the first and second transistors are arranged as a current mirror; wherein the capacitor is connected to the first and second transistors and configured and arranged such that during operation the first transistor, the second transistor and the capacitor operate as a high pass filter.

The capacitor may be connected to a source and gate of the first transistor, and a gate of the second transistor. The first transistor may act as the impedance of the high pass filter and the gate source capacitances of the first and second transistors and the capacitor are the capacitance of the high pass filter. The impedance of the first filter transistor may be the gate-source impedance of the first transistor.

The capacitor and the first transistor may be configured an arranged to detect a change in the supply voltage. The capacitance of the capacitor is greater than the combined capacitance of the first transistor and the second transistor. The second transistor is arranged to be connected to the output stage and wherein the output stage is a CMOS driver.

The second transistor may be connected to a further circuit, wherein the further circuit has a capacitive and resistive load.

The filter circuit may further comprise an enable circuit, to switchably operate the filter circuit, wherein the enable circuit comprises a third transistor connected to the source of the first transistor and a supply voltage detection circuit connected to a gate of the third transistor.

The filter circuit may optionally comprise an enable circuit, to switchably operate the filter circuit, wherein the enable circuit comprises a third transistor connected to the source of the first transistor and a supply voltage detection circuit connected to a gate of the third transistor.

According to embodiments there is also provided an output stage of an electronic circuit comprising the filter circuit according to embodiments.

According to embodiments there is also provided logic circuit comprising the output stage.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

DETAILED DESCRIPTION

Figure 1:
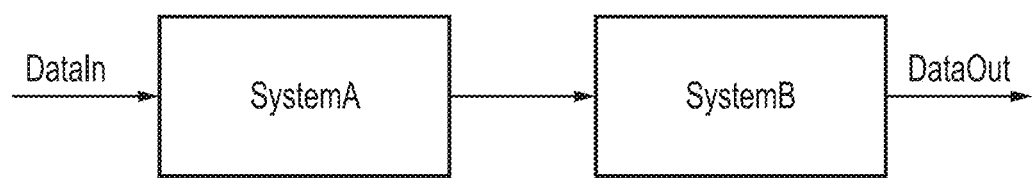
FIG. 1 shows a known generalised data transfer system.

A filter circuit 202 in accordance with an embodiment is illustrated in the circuit diagram of FIG. 2a. The filter circuit 202 may comprise a first filter transistor 204, a second filter transistor 206 and a filter capacitor 208. A supply voltage VCC 210 is connected in series with the filter capacitor 208 and a first terminal of the first filter transistor 204. A second terminal of the first filter transistor 204 is connected to ground 212. The first filter transistor 204 is arranged as a diode connected transistor, whereby the first terminal of the of the first filter transistor 204 is connected to the gate terminal thereof. The first filter transistor 204 and second filter transistor 206 are connected to form a current mirror.

The arrangement of the filter capacitor 208 and first and second transistors 204, 206 as a current mirror, may be switched between a series arrangement of capacitors illustrated in FIG. 2b, and a high-pass filter, illustrated in FIG. 2c. Before the supply voltage VCC 210 reaches the threshold voltage of the first and second filter transistors 204, 206, the filter circuit 202 acts as a series of capacitances, namely the filter capacitor 208 and the sum of the gate-source capacitances Cgs of the first and second filter transistors 204, 206, as shown in FIG. 2c. However, when the supply voltage VCC 210 reaches the threshold voltage of the first and second filter transistors 204 (the voltage at node 215 being equal), the first filter transistor 204 switches on and thus provides an impedance, 1/gm (where gm is the transconductance of the first filter transistor 204) in parallel with the sum of the gate-source capacitances Cgs of the first and second filter transistors 204, 206. The high pass filter of FIG. 2b may then attenuate an unwanted bump event, such that the magnitude of the bump at an output 214 of the filter circuit is reduced when compared to the bump which occurred during the rise time of the supply voltage VCC 210.

In more detail, as the supply voltage VCC 210 rises and before the first filter transistor 204 turns on, the voltage at the node 215 of first terminal and gate of the first filter transistor 204 increases linearly based on the ratio of first filter transistor 204 capacitance and filter capacitor 208 (as shown in FIG. 2b). After the first filter transistor 204 turns on, and during supply voltage VCC 210 ramp up, node 215 holds the voltage that is already coupled when first filter transistor 204 is off. During the remaining ramp up cycle the second transistor 206 turns on and draws current from the output driver (illustrated as output driver stage 442 of circuit 440 in FIG. 4) and no current flows to the external capacitor of the external circuit at output 44 of the driver circuit.

As mentioned above, the filter capacitor 208 and the first filter transistor 204 are arranged to operate as a high pass filter. Specifically, when the first filter transistor 204 turns on, the diode connected transistor arrangement with the second filter transistor 206 offers the impedance of 1/gm, which is the drain source impedance of the first filter transistor, in parallel with the combined capacitance of the first filter transistor 204 and second filter transistor 206. Since this arrangement acts as a high pass filter it keeps a constant voltage at node 215 during the remaining supply ramp up cycle. The gate of the first filter transistor 204 is connected to the gate of the second filter transistor 206.

A first terminal of the second filter transistor 206 is arranged as the output 214 of the bump filter circuit 202. A second terminal of the second filter transistor 206 is connected to ground 212.

In applications, as discussed in more detail below with reference to FIG. 4, the output 214 of the bump filter 202 is typically connected to the output driver stage (not illustrated in FIG. 2) of a functional circuit, such as a logic circuit as illustrated. Therefore, because the voltage is constant at node 215, the current is constant though node 215 and the drain source current through the second filter transistor 206 is equal to the drain source current through the first filter transistor 204.

The first and second filter transistors 204, 206 are typically operated in saturation mode. The first filter transistor 204 is in saturation because the drain source voltage Vds will be greater that the difference between the gate source voltage Vgs and the threshold voltage Vth of the first filter transistor 204. The second filter transistor 206 also turns on in saturation because there is voltage already coupled to the output through the driver. Therefore, when first filter transistor 204 turns on, the second filter transistor 206 also turns on in saturation. Assuming that 100 mV is present on the output capacitance of the output 444 of the driver circuit due to coupling through the driver, when supply ramps up and Vth is 600 mV, if voltage on node 215 goes above 600 mV, second filter transistor 206 turns on in saturation because the drain source voltage Vds is 100 mV.

The filter circuit 202 operates only when the supply voltage 210 turns on and is ramping up. As discussed in more detail below, the supply voltage 210 will increase to a maximum over time. When the supply voltage 210 turns on and ramps up, the filter circuit 202 turns on and prevents any voltage coupling to the external capacitor by turning on bump filter circuit 202. Any bump that is coupled through parasitic capacitance of the driver circuit is therefore filtered by the filter circuit 202. In addition, through the use of the high pass filter mentioned above, the filter circuit 202 operates to remove certain frequencies where high frequency coupling effects arise. That is the filter circuit 202 removes bumps which are equal to or higher than a predetermined frequency.

As the amplitude of the bump reduces with reduction in supply voltage ramp rate 210, the voltage on node 215 also reduces with the reduction in ramp rate so that the amount of current drawn from the output 214 reduces with the corresponding reduction in frequency. The high pass filter feature of the filter counteracts the low pass behaviour of a bump event.

As the supply voltage rises, the voltage at the node 215 of first terminal and gate of the first filter transistor 204 will rise correspondingly. As the voltage at the node 215 increases and then reaches the threshold voltages, Vth of the first filter transistor 204 and second filter transistor 206. It should be noted that the threshold voltages of the first filter transistor 204 and the second filter transistor 206 are equal. At the threshold voltage Vth, the first filter transistor 204 and the second filter transistor 206 will consequently be turned on and the second filter transistor 206 discharges the voltage coupled to the output 214 and prevents further incremental change in the voltage on the output 214.

Assuming that the supply voltage VCC 210 increases from 0V to 0.7V and that a bump event of 0.1V is coupled to the output 214. As the supply voltage VCC 210 increases further, the first filter transistor 204 turns on and provides low impedance path to ground by turning on the second filter transistor 206. The voltage on the node 215 stops increasing and maintains low impedance path to ground until supply voltage VCC 210 reaches its maximum value.

The filter capacitor 208 and the first filter transistor 204 are selected based on the maximum ramp rate of the supply voltage VCC 210. When supply voltage VCC 210 increases from 0V to 0.8V, the first filter transistor 204 and the filter capacitor 208 are selected such that the voltage on the node 215 reaches the threshold voltage 0.7V of first and second filter transistors 204, 206. Based on the desired attenuated magnitude of the bump event, the specific value of the filter capacitance and the capacitances of the first and second filter transistors 204, 206 selected such that the specific capacitance value (farad) of the filter capacitor 208 is larger than the combined gate-source capacitance the first and second filter transistor 204, 206.

In one example, non-limiting, application the maximum supply voltage 210 ramp rate from 0V to VCC may be 50 μs. The external load capacitance may be 5 pF—and the external load resistance may be 1 MΩ and a typical bump event amplitude (assuming no filter) will be approximately 700 mV. For a bump filter circuit 202 according to embodiments, where the filter capacitor 208 is 1.8 pF, and the ratio of the capacitance of the first filter transistor 204 and the filter capacitor 208 is as low as possible so that switching on of the first filter transistor 204 synchronises with the occurrence of the bump. This arrangement may result in a bump of amplitude of approximately 100 mV.

Figure 2:
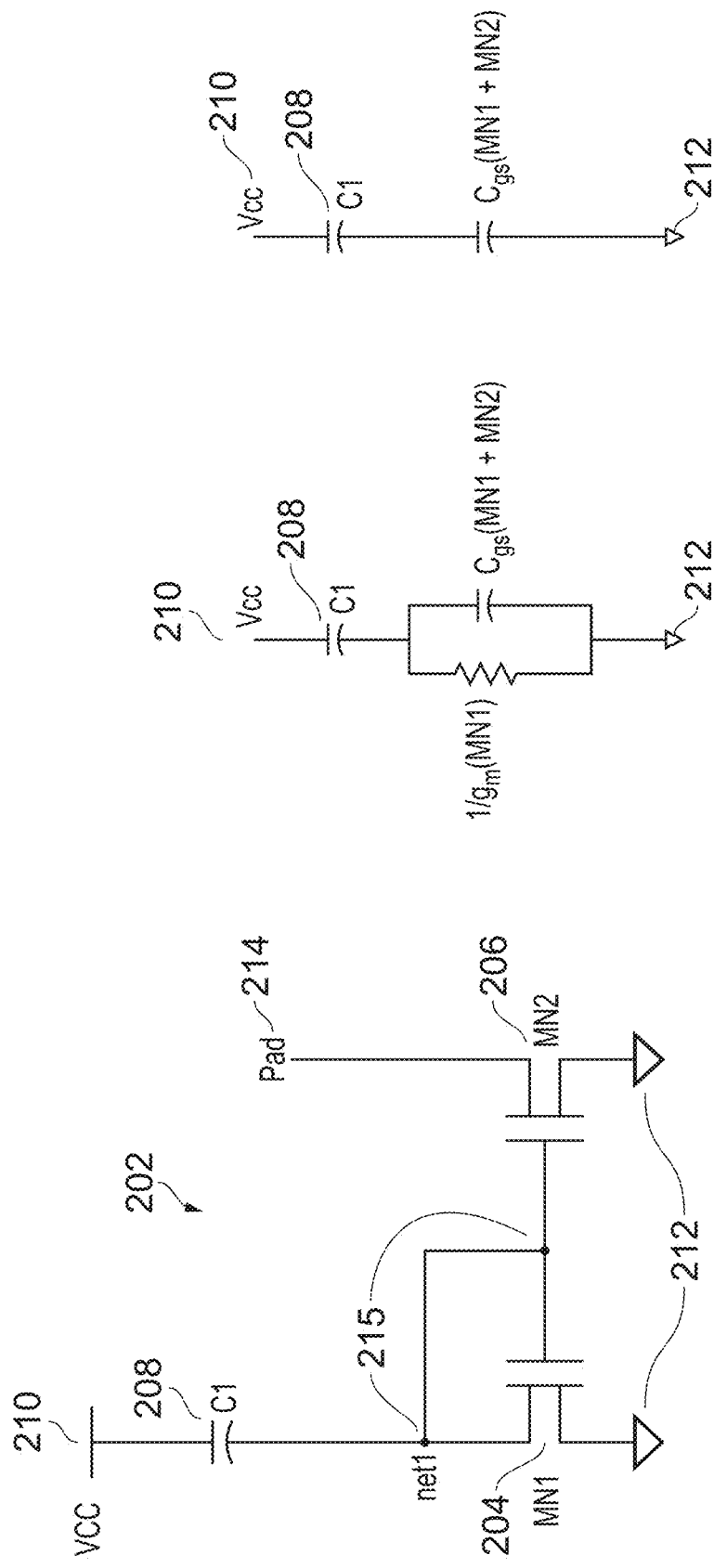
FIG. 2a illustrates a circuit diagram of filter circuit for an electronic circuit according to an embodiment.
FIG. 2b illustrates an equivalent circuit diagram to that of FIG. 2a for a filter circuit for an electronic circuit during operation according to an embodiment.
FIG. 2c illustrates an equivalent circuit diagram to that of FIG. 2a for a bump filter circuit for an electronic circuit according to an embodiment, during operation as the supply voltage ramps-up.
Figure 3:
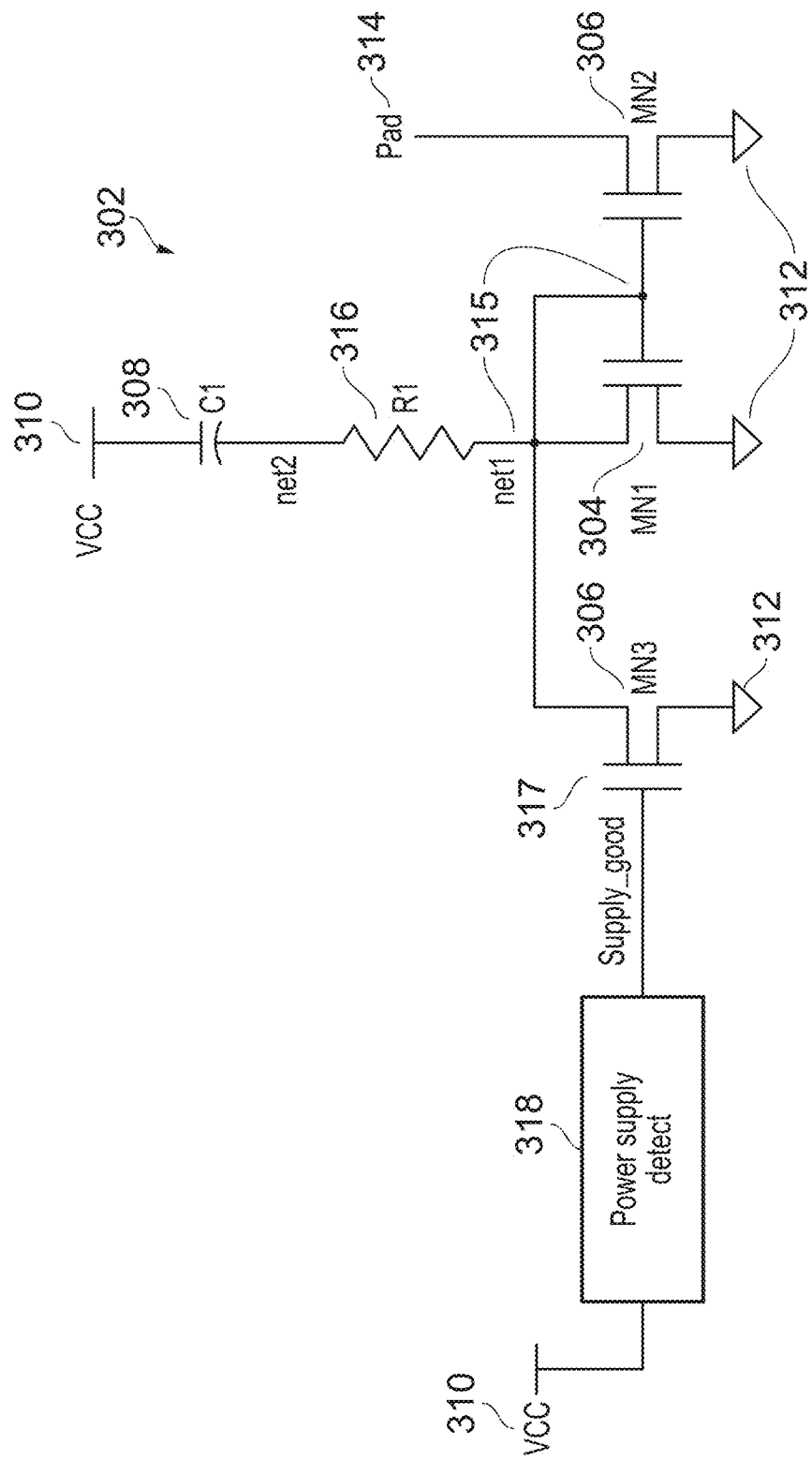
FIG. 3 illustrates a bump filter circuit for an electronic circuit comprising an enable control according to an embodiment.

A filter circuit 302 in accordance with a further embodiment is illustrated in the circuit diagram of FIG. 3. As with the arrangement of FIG. 2, discussed above, the bump filter circuit 302 may comprise a first filter transistor 304, a second filter transistor 306 and a filter capacitor 308. A supply voltage 310 is connected in series with the filter capacitor 308, a filter resistor 316 and a first terminal of the first filter transistor 304. A second terminal of the first filter transistor 304 is connected to ground 312. The first filter transistor 304 is arranged as a diode connected transistor, whereby the first terminal of the of the first filter transistor 304 is connected to the gate terminal thereof. The filter capacitor 308 and the first filter transistor 304 are arranged as a high pass filter. The gate of the first filter transistor 304 is connected to the gate of the second filter transistor 306. A first terminal of the second filter transistor 306 is arranged as the output 314 of the bump filter circuit 302. A second terminal of the second filter transistor 306 is connected to ground 312.

The filter resistor 316 is arranged to handle electrostatic discharge (ESD) events. When an ESD event occurs, the filter capacitor 308 provides a low impedance path which can create currents that may damage either the filter circuit 302 itself or the circuit connected to the output 314. By including the filter resistor 316 the current is limited during ESD event. Specifically, the filter resistor 316 limits high frequency ESD events passed by the filter capacitor 308, whilst also ensuring that the voltage drop is kept to a minimum. In this regard the voltage drop across the filter resistor 316 should be less than the voltage drop across the first filter transistor 304 such that the majority of the voltage drop occurs across the first filter transistor 304. Typically, the filter resistor 316 may be approximately a 2KΩ resistor. Similar to the arrangement of FIG. 2, for the filter 302 of FIG. 3, the filter capacitor 308 and the first filter transistor 304 are selected based on the maximum ramp rate of the supply voltage 310 and the specific capacitance value (farads) of the filter capacitor 308 is larger than the combined gate-source capacitance of each of the first filter transistor 304 and the second filter transistor 306.

In the arrangement of FIG. 3, the filter circuit 302 may also comprise an enable control circuit which comprises an enable transistor 317 and a power supply detector 318. A first terminal of the enable transistor 317 is connected to the first terminal of the first filter transistor 304 at node 315. A gate terminal of the enable transistor 317 is connected to the output of a power supply detector 318, and the power supply detector 318 is connected to the supply voltage 310. Enable transistor 317 is selected such that the gate source leakage current is low and any excess voltage coupling during ramp-up of the supply voltage 310 is avoided.

When the supply voltage VCC 310 reaches a maximum (or in other words a valid voltage level) such as 5 Volts, a disable signal is generated by the power supply detector 318 which disables the filter 302 circuit. The filter 302 is disabled by switching on the enable transistor 317 and thus bypassing the first filter transistor 304 and second filter transistor 306, because any current generated by the supply voltage 310 will flow through the filter capacitor 308 and filter resistor 316 to ground 312. In this way when the gate voltage, indicated by Supply_good, of the enable transistor 317 is greater than the threshold voltage of the enable transistor 317, the filter 302 is disabled. Therefore, the Supply_good signal is generated only when supply voltage is stable and there is no chance of a bump event.

The filter capacitor 308, the filter resistor 316 and the first filter transistor 304 are used to detect a change in supply voltage 310. Before the power supply detect circuit 318 is turned on, the filter circuit 302 is turned on and attenuates the bump voltage. When the Supply_good signal is asserted the bump filter actively draws the excess current from the output driver 442 (see FIG. 4). The second filter transistor 306 then removes the voltage that is coupled to the output due to high frequency effects on the supply voltage as it powers up. As the supply voltage 310 switches on it will take a finite period of time (see FIG. 5b) to reach a maximum or valid voltage level, this finite period of time is known as the rise time. When the supply voltage reaches the threshold voltage Vth of the first and second filter transistor 304, 306 the transistors 304, 306 will turn on and remove the bump event that would have otherwise been coupled to the output 314, due to the rising supply voltage 310, by actively drawing current and preventing from appearing at the output 314.

The second filter transistor 306 will not switch on until the threshold voltage is reached and the attenuated bump, as discussed above, is observed at the output 314.

With reference to the arrangements of FIG. 2 and FIG. 3, the first terminal and second terminal of the first filter transistor 204, 304 and enable transistor 316 may be, respectively, drain terminals and source terminals. Likewise, the first terminal and second terminal of the second filter transistor 206, 306 and enable transistor 316 may be, respectively, a drain terminal and a source terminal. The first filter transistor 204, 304 and the second filter transistor 206, 306 may be NFET or NMOS transistors. In addition, from the above discussion, the skilled person will see that the control circuit of FIG. 3 may likewise be used with the bump filter circuit of FIG. 2 by connecting the first terminal of the enable transistor 317 to node 215.

The bump filter circuit 202, 302 according to embodiments can therefore detect the change in supply voltage and attenuate the any high frequency voltage bumps that may occur.

Figure 4:
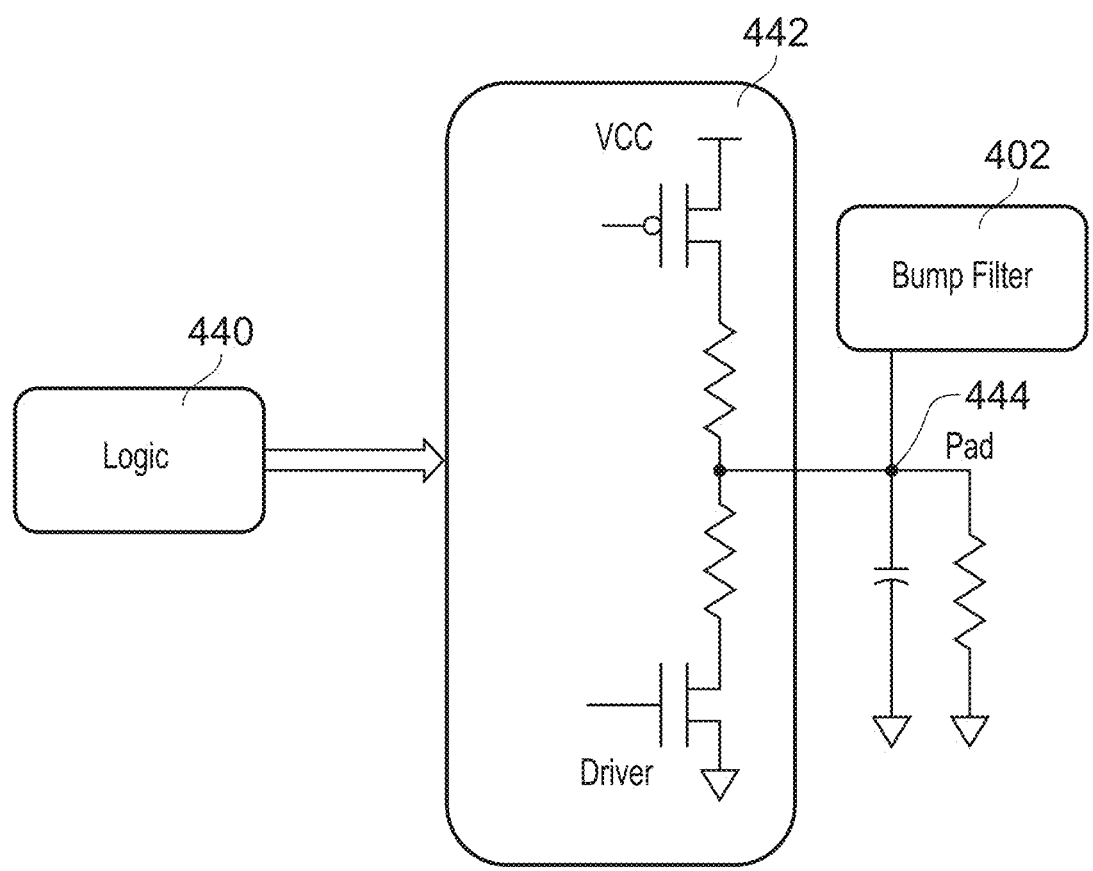
FIG. 4 illustrates the bump filter circuit according to embodiments connected to the output stage of a logic circuit.

FIG. 4 illustrates a bump filter 402 according to embodiments connected to an output driver stage 442 of a circuit 440. The circuitry 440, may provide the functionality such as Level-shifting, NOR, NAND, XOR, AND, NOT, XNOR and OR is connected to the CMOS output driver stage 442.

Whilst the embodiment of FIG. 4 relates to logic functionality, the skilled person will see that the present disclosure is also relevant for any circuit having CMOS driver the output stage. For example, the filter 202, 302 according to embodiments may also be applicable to high speed IO circuits such as high speed serializer and deserializer and high-speed clock drivers.

The filter may be arranged according to the embodiments of FIG. 2 or FIG. 3 such that the output 214, 314 is connected to the output 444 of the driver circuit. As illustrated in FIG. 4, the resistor and the capacitor connected to the output merely represent the load resistance and capacitance of the external circuit of the output driver stage 442.

Figure 5:
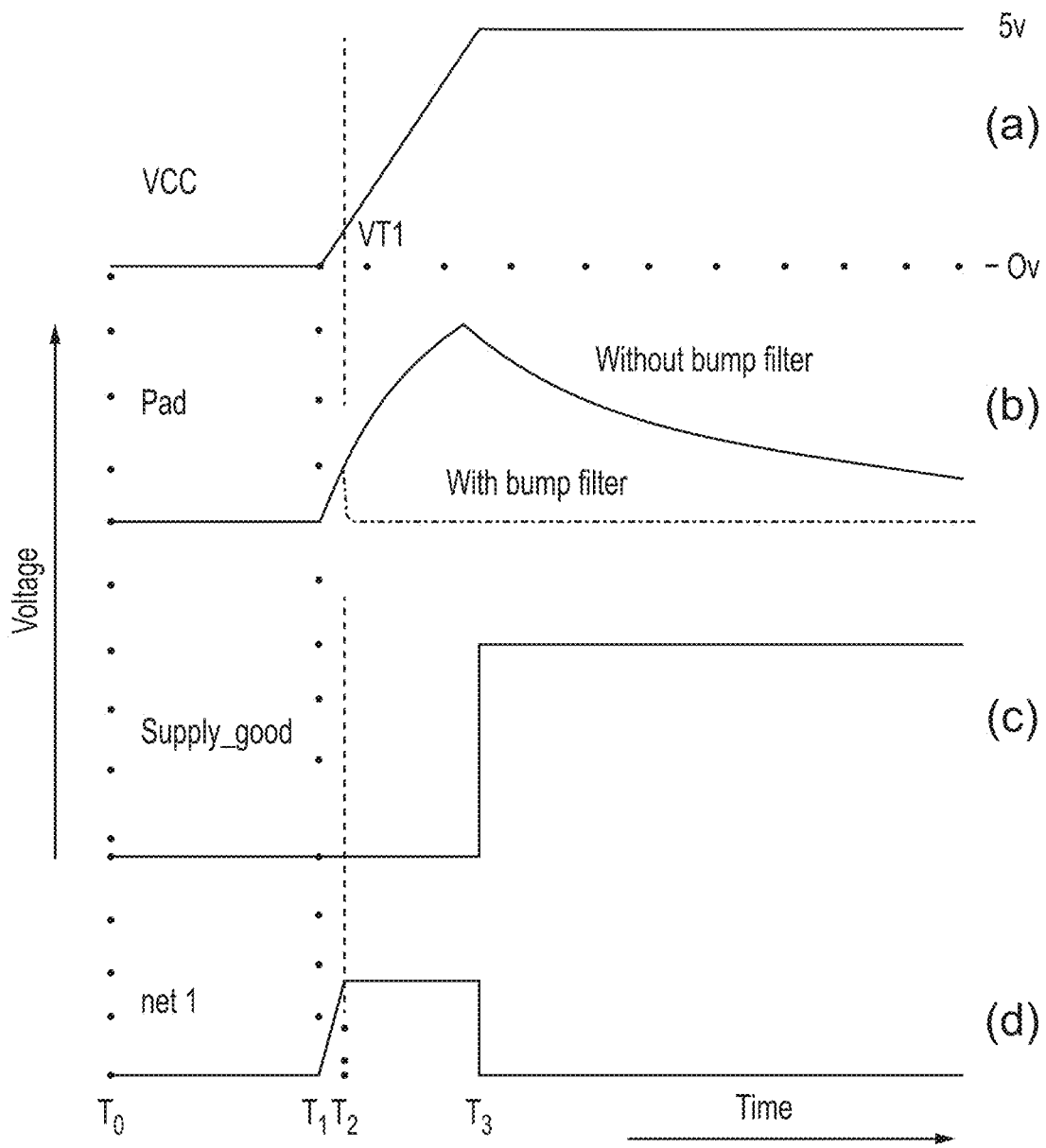
FIG. 5 illustrates supply waveforms and output waveforms with and without the bump filter according to some embodiments.

In terms of operation FIGS. 5(a) to 5(d) illustrate various plots of voltage versus time, comparing circuits with and without a filter 202, 302 according to embodiments. FIG. 5(a) shows how the supply voltage 210, 310 increases over time from a minimum, for example 0 volts, to a maximum (or valid voltage level), for example 5 volts. In the situation where no filter circuit is used (as indicated by the solid line in FIG. 5(b)), a bump event will appear on the output 444 of the output driver stage. However, in the situation where a bump filter 202, 302 according to embodiments is used (as indicated by the dotted line in FIG. 5(b)) the amplitude of the bump event is attenuated as described above.

In the plots of FIGS. 5(a) to 5(d) the supply voltage 210, 310 is zero at time T0. At time T1, the supply voltage 210, 310 switches on and rises to a maximum or valid voltage level at T3. From T1 to T2, the voltage at node 215, 315 increases to the threshold voltage Vth of the first and second filter transistors 204, 206, 304, 306, based on the capacitance ratio of device capacitances of the first and second filter transistors 204, 206, 304, 306 and the filter capacitor 308. From T2 to T3, the filter circuit according to embodiments acts as a high pass filter and attenuates the bump such that a bump of reduced magnitude (as indicated by the dotted line in FIG. 5(b)) appears at the output 214, 314 of the filter circuit 202, 302.

FIG. 5(c) shows an enable signal generated by the power supply detect circuit to disable the filter circuit. The signal is enabled at T3 after the supply voltage 310 become stables. FIG. 5(d) is the voltage on node 215, 315 increases and reaches above the threshold voltage. This ensures that filter circuit turns on provided that the supply voltage is ramping up by enabling the first and second filter transistors 304 and 306.

Figure 6:
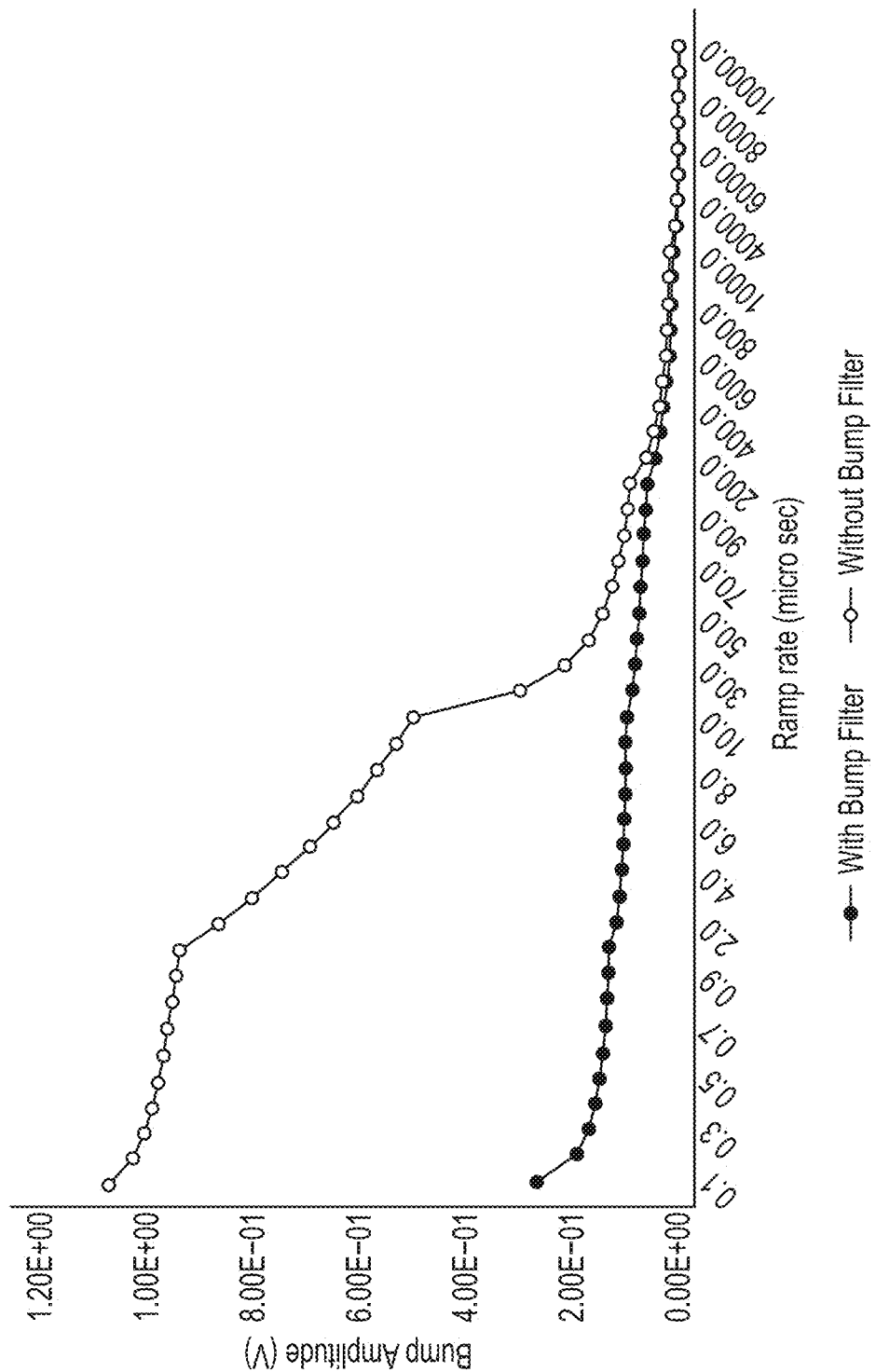
FIG. 6 is a plot of bump amplitude versus voltage supply ramp rate on the output of a circuit with and without the bump filter.

FIG. 6 is a plot of bump amplitude versus voltage supply ramp rate on the output of output driver stage with and without the filter circuit according to embodiments. As can be shown the magnitude of bump is reduced, in particular for ramp rates from 0.1 µs to 200 µs.

Figure 7:
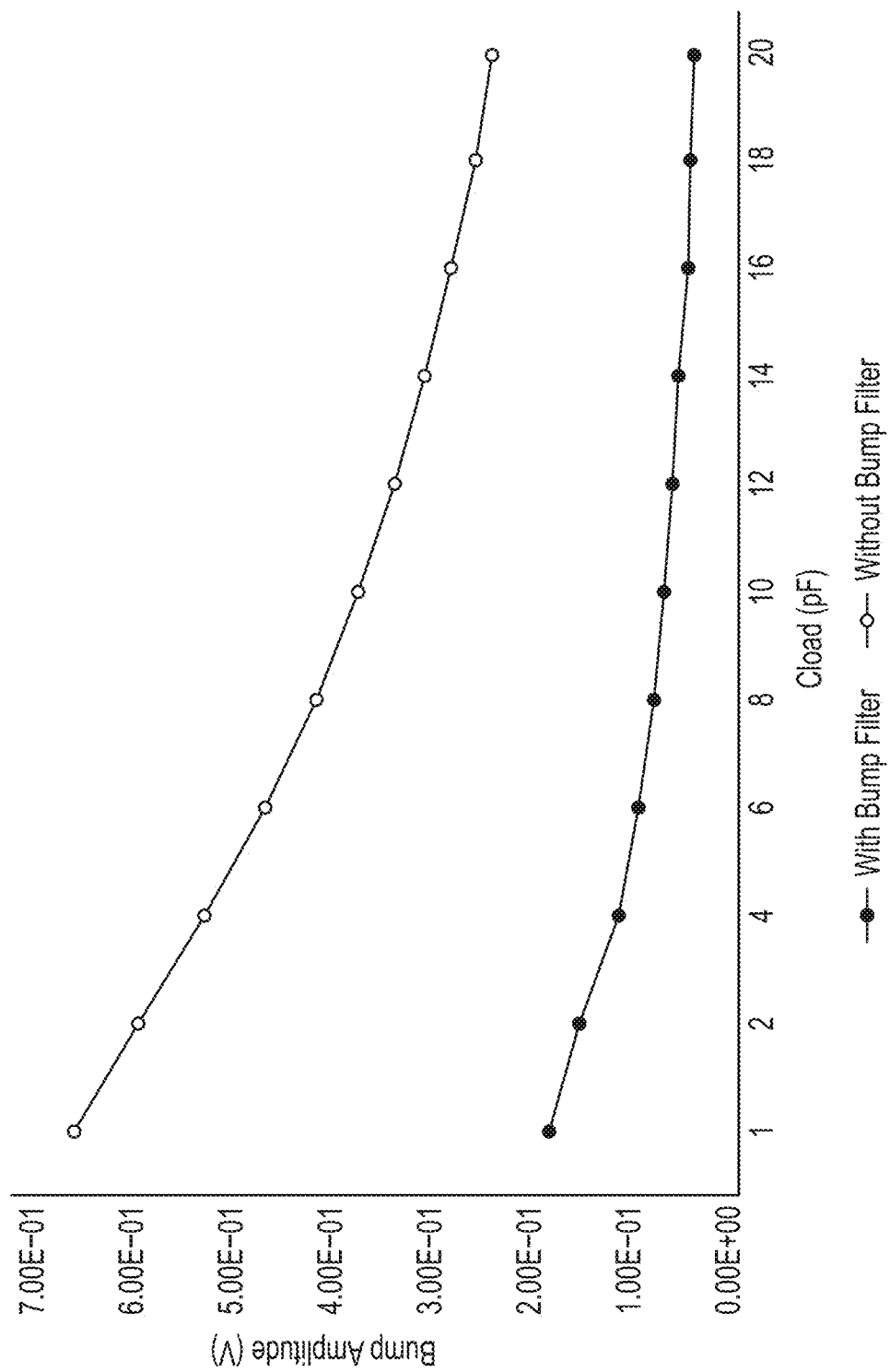
FIG. 7 is a plot bump amplitude versus load capacitance on the output of a circuit with and without the bump filter.

FIG. 7 is a plot bump amplitude versus load capacitance at the output 444 of the driver circuit 442 with and without the filter circuit according to embodiments. The amplitude of the bump is clearly reduced over the range of load capacitances from 1 to 20 pF.

Whilst the foregoing examples illustrate embodiments with respect to logic circuits, the embodiments are not limited thus. The skilled person will appreciate that embodiments also relate to analog and mixed signal circuits having drivers to drive capacitive loads on the output of said drivers.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

Term "comprising" does not exclude other elements or steps, the term "a" or "an" does not exclude a plurality. Reference signs in the claims shall not be construed as limiting the scope of the claims.

What is claimed is:

1. A bump filter circuit for an output stage of an electronic driver circuit, the bump filter circuit comprising:
    a capacitor connected between a supply voltage terminal and a first transistor;
    wherein the first transistor is arranged as a diode connected transistor;
    a second transistor connected to the first transistor so that the first transistor and the second transistor are arranged as a current mirror; and
    wherein the bump filter circuit is operatively connected to an output pad or pin of the electronic driver circuit,
    wherein the capacitor is connected to the first transistor and the second transistor and configured and arranged so that during operation the first transistor, the second transistor and the capacitor operate as a high pass filter configured to attenuate a bump event on the output pad or pin when the supply voltage reaches a threshold voltage of the first transistor and the second transistor during a ramp up cycle of the electronic driver circuit.

2. The filter circuit of claim 1, wherein the capacitor is connected to a source and a gate of the first transistor, and a gate of the second transistor.

3. The filter circuit of claim 2, wherein the first transistor has an impedance of the high pass filter.

4. The filter circuit of claim 3, wherein the first transistor, the second transistor, and the capacitor have a gate source capacitance, and wherein the high pass filter has a capacitance that is the gate source capacitance.

5. The filter circuit of claim 4, wherein the capacitor and the first transistor are configured and arranged to detect a change in a supply voltage of the supply voltage terminal.

6. The filter circuit of claim 1, wherein the first transistor has an impedance of the high pass filter.

7. The filter circuit of claim 6, further comprising a first filter transistor having an impedance, and wherein the first transistor has a gate-source impedance that is the impedance of the first filter transistor.

8. The filter circuit of claim 1, wherein the first transistor, the second transistor, and the capacitor have a gate source capacitance, and wherein the high pass filter has a capacitance that is the gate source capacitance.

9. The filter circuit of claim 8, wherein the capacitor has a capacitance greater than a combined capacitance of the first transistor and the second transistor.

10. The filter circuit of claim 9, wherein the second transistor is arranged to be connected to the output stage, and wherein the output stage is a CMOS driver.

11. The filter circuit of claim 1, wherein the capacitor and the first transistor are configured an arranged to detect a change in a supply voltage of the supply voltage terminal.

12. The filter circuit of claim 1, wherein the capacitor has a capacitance greater than a combined capacitance of the first transistor and the second transistor.

13. The filter circuit of claim 1, wherein the second transistor is arranged to be connected to the output stage, and wherein the output stage is a CMOS driver.

14. The filter circuit of claim 1, wherein the second transistor is connected to a further circuit, and wherein the further circuit has a capacitive load and a resistive load.

15. The filter circuit of claim 1, further comprising
an enable circuit to switchably operate the filter circuit, wherein the enable circuit comprises a third transistor connected to a source of the first transistor; and
a supply voltage detection circuit is connected to a gate of the third transistor.

16. The filter circuit of claim 1, further comprising a resistor connected between the first transistor and the capacitor, wherein the resistor is arranged to absorb electro-static discharge (ESD) events.

17. An output stage of an electronic circuit comprising the filter of claim 1.

18. A logic circuit comprising the output stage of claim 17.

* * * * *

UNITED STATES PATENT AND TRADEMARK OFFICE
CERTIFICATE OF CORRECTION

PATENT NO. : 10,917,073 B2
APPLICATION NO. : 16/664454
DATED : February 9, 2021
INVENTOR(S) : Asam et al.

Page 1 of 1

It is certified that error appears in the above-identified patent and that said Letters Patent is hereby corrected as shown below:

On the Title Page

Item (30) Please add this entry in Column 1:
Foreign Application Priority Data
October 26, 2018 (EP) 18202939

Signed and Sealed this
Fifteenth Day of June, 2021

Drew Hirshfeld
*Performing the Functions and Duties of the*
*Under Secretary of Commerce for Intellectual Property and*
*Director of the United States Patent and Trademark Office*